United States Patent
Akerman et al.

(10) Patent No.: US 12,237,146 B2
(45) Date of Patent: Feb. 25, 2025

(54) DETERMINING A DEPTH OF A HIDDEN STRUCTURAL ELEMENT BACKGROUND

(71) Applicant: Applied Materials Israel Ltd., Rehovot (IL)

(72) Inventors: Lior Akerman, Rehovot (IL); Vadim Kuchik, Kiriat Ekron (IL)

(73) Assignee: Applied Materials Israel Ltd., Rehovot (IL)

( * ) Notice: Subject to any disclaimer, the term of this patent is extended or adjusted under 35 U.S.C. 154(b) by 193 days.

(21) Appl. No.: 17/709,272

(22) Filed: Mar. 30, 2022

(65) Prior Publication Data

US 2023/0317407 A1     Oct. 5, 2023

(51) Int. Cl.
| | |
|---|---|
| H01J 37/27 | (2006.01) |
| H01J 37/22 | (2006.01) |
| H01J 37/244 | (2006.01) |
| H01J 37/28 | (2006.01) |

(52) U.S. Cl.
CPC .......... *H01J 37/244* (2013.01); *H01J 37/222* (2013.01); *H01J 37/28* (2013.01)

(58) Field of Classification Search
CPC ......... H01J 37/244; H01J 37/222; H01J 37/28
See application file for complete search history.

(56) References Cited

U.S. PATENT DOCUMENTS

| | | | | |
|---|---|---|---|---|
| 4,609,867 | A * | 9/1986 | Schink | G01R 31/265 324/754.21 |
| 6,670,610 | B2 | 12/2003 | Shemesh et al. | |
| 8,709,269 | B2 | 4/2014 | Shemesh | |
| 2019/0051490 | A1* | 2/2019 | Tsuno | G01N 23/225 |
| 2021/0366685 | A1* | 11/2021 | Yokosuka | H01J 37/222 |

* cited by examiner

*Primary Examiner* — Nicole M Ippolito
(74) *Attorney, Agent, or Firm* — Kilpatrick Townsend & Stockton LLP

(57) ABSTRACT

A method for determining a depth of a hidden structural element of an object, the method may include (i) obtaining contrast information regarding a contrast between (a) hidden structural element detection signals that are indicative of electrons emitted from the hidden structural element, and (b) surroundings detection signals that are indicative of electrons emitted from a surroundings of the hidden structural element; wherein the hidden structural element detection signals and the surroundings detection signals are detected as a result of a scanning of a region of the object, with an illuminating electron beam; wherein the region comprises the hidden structural element and the surroundings; and (ii) determining the depth of the hidden structural element based, at least in part, on the contrast information.

20 Claims, 9 Drawing Sheets

DETERMINING A DEPTH OF A HIDDEN STRUCTURAL ELEMENT BACKGROUND

BACKGROUND OF THE INVENTION

A region of an object may be evaluated by scanning of the region with an illuminating electron beam. The evaluation may include at least one out of metrology, inspection and review. The object may be a semiconductor wafer, a semiconductor die or an object that differs from a semiconductor object.

The illuminating electron beam impinges on a surface of the region and causes an emission of surface secondary electrons.

The illuminating electron beam also penetrates through the surface of the region and cause backscattered electrons to be emitted from below the surface of the region.

The backscattered electrons propagate towards the surface of the region and cause an emission of backscattered electrons (BSE) induced secondary electrons.

A secondary electron detector can detect a combination of the surface secondary electrons and the BSE induced secondary electrons but cannot provide accurate information about hidden structural elements.

BRIEF SUMMARY OF THE INVENTION

There may be provided a system, method and a non-transitory computer readable medium for reducing BSE induced error.

A method for determining a depth of a hidden structural element of an object, the method may include (i) obtaining contrast information regarding a contrast between (a) hidden structural element detection signals that are indicative of electrons emitted from the hidden structural element, and (b) surroundings detection signals that are indicative of electrons emitted from a surroundings of the hidden structural element; wherein the hidden structural element detection signals and the surroundings detection signals are detected as a result of a scanning of a region of the object, with an illuminating electron beam; wherein the region comprises the hidden structural element and the surroundings; and (ii) determining the depth of the hidden structural element based, at least in part, on the contrast information.

There may be provided a non-transitory computer readable medium for determining a depth of a hidden structural element of an object, the non-transitory computer readable medium stores instructions for: (i) obtaining contrast information regarding a contrast between (a) hidden structural element detection signals that are indicative of electrons emitted from the hidden structural element, and (b) surroundings detection signals that are indicative of electrons emitted from a surroundings of the hidden structural element; wherein the hidden structural element detection signals and the surroundings detection signals are detected as a result of a scanning of a region of the object, with an illuminating electron beam; wherein the region comprises the hidden structural element and the surroundings; and (ii) determining the depth of the hidden structural element based, at least in part, on the contrast information.

There may be provide a computerized system for determining a depth of a hidden structural element of an object, the computerized system may include a processing circuit that is configured to: (i) receive contrast information regarding a contrast between (a) hidden structural element detection signals that are indicative of electrons emitted from the hidden structural element, and (b) surroundings detection signals that are indicative of electrons emitted from a surroundings of the hidden structural element; wherein the hidden structural element detection signals and the surroundings detection signals are detected as a result of a scanning of a region of the object, with an illuminating electron beam; wherein the region comprises the hidden structural element and the surroundings; and (ii) determine the depth of the hidden structural element based, at least in part, on the contrast information.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION OF THE INVENTION

Figure 1:
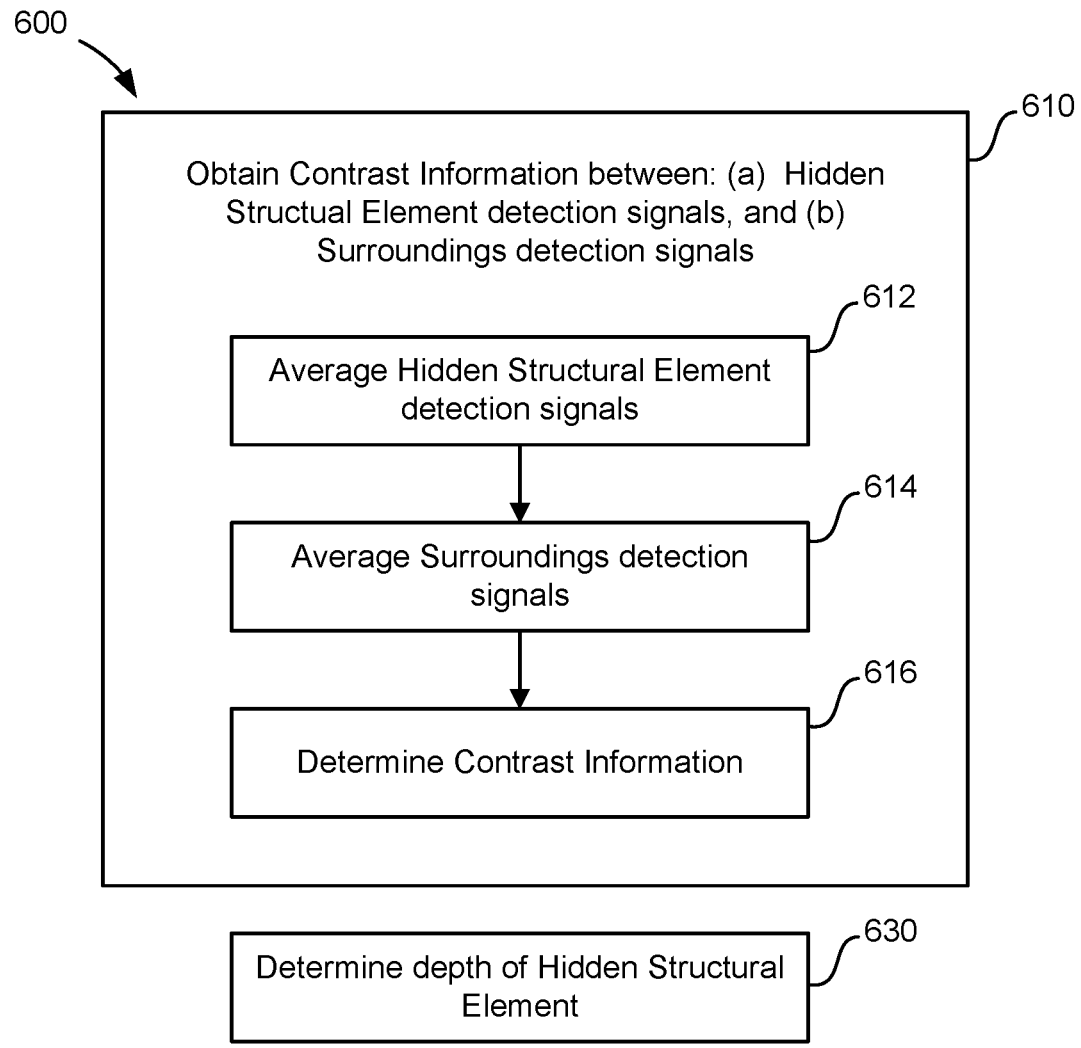
FIG. 1 is an example of a method.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method.

Any reference in the specification to a system should be applied mutatis mutandis to a method that may be executed by the system.

The term "and/or" means additionally or alternatively.

The term "corresponding" when referring to different images means located at the same location in the different images—for example at a same combination of row value and column value.

The term "region" of a sample may be the entire sample or only one or more parts of the region. The sample may be a semiconductor wafer or another sample.

The term "underlaying" may be located beneath the surface of the sample—below the layer from which surface SE are emitted.

Depth Finding

FIG. 1 illustrates method 600 for determining a depth of a hidden structural element of an object.

Method 100 may start by step 610 of obtaining contrast information regarding a contrast between (a) hidden structural element detection signals that are indicative of electrons emitted from the hidden structural element, and (b) surroundings detection signals that are indicative of electrons emitted from a surroundings of the hidden structural element.

The hidden structural element detection signals and the surroundings detection signals are detected as a result of a scanning of a region of the object, with an illuminating electron beam. The region includes the hidden structural element and the surroundings.

The hidden structural element detection signals and the surroundings detection signals may be backscattered electrons. The hidden structural element detection signals and the surroundings detection signals may form a part of a backscattered electron image.

Additionally or alternatively, the hidden structural element detection signals and the surroundings detection signals may be backscattered electrons induced secondary electrons.

Step 610 may be followed by step 630 of determining the depth of the hidden structural element based, at least in part, on the contrast information.

The contrast information may be a function of the depth of the hidden structural element. This function may be learnt in advance, for example by simulation, and/or measurements, especially measurements related to hidden structural elements of known depth.

The contrast information may be a function of the depth of the hidden structural element and one or more evaluation parameters.

The one or more evaluation parameter may include at least one illumination parameter and, additionally or alternatively, at least one collection parameter. For example, a landing energy of the illuminating electron beam, an intensity of the illuminating electron beam, a gain of a collection path, a sensitivity of a detector, a gain of the illumination path, and the like.

The contrast information may be a function of the depth of the hidden structural element and path information. The path information may be indicative of one or more paths between a surface of the object and at least one out of the hidden structural element and the surroundings.

The one or more paths may include a path through which backscattered electrons propagate.

The one or more paths may include a path through which the illuminating electron beam propagates.

The one or more paths may include a path through which the BSE induced secondary electrons propagate.

Any of the one or more paths may impact the intensity of the detected signals, the yield of any of the BSE induced secondary electrons, the yield of the backscattered electrons, and the like.

Less electrons (being backscattered electrons or BSE induced secondary electrons) are emitted from paths that are more absorbing.

Fewer electrons are emitted when the illuminating electron beam propagates along a more absorbing path. These fewer electrons may be emitted from shallower parts of the region—but the depth of the path does not necessarily determined the emission. It should be noted that a deeper structure may have higher or lower contrast in comparison to a shallower structure, depending on a combination of landing energy, thickness of the feature and the stack.

Step 610 may be executed while applying an evaluation parameter of the first value.

Step 610 may be repeated multiple times to include an execution of step 610 while applying, during different repetitions, the evaluation parameter of different values.

The different values, once applied, may obtain contrast information related to different depths of the region.

It should be noted that step 610 may be applied while applying a first setup, and that other repetitions of step 610 may applied while applying a second setup that differs from the first setup.

The first setup may define a first combination of values of evaluation parameters. The second setup may define a second combination of values of evaluation parameters. The first combination may differ from the second combination by at least one value of one evaluation parameter.

Different repetitions of step 610 may be applied on the same region—or may differ from each other by the region they are applied.

For example, when applied on the same region, the contrast information can more accurately detect the depth of a hidden structural element. The hidden structural element of a certain depth may exhibit a unique signature that includes different contrast values for different landing energies of the illuminating light beam.

The hidden structural element may include an edge and a non-edge part. The contrast information may be calculated while ignoring edge points and taking into account the non-edge points.

Step 610 may include:

Step 612 of averaging hidden structural element detection signals related to electrons emitted from non-edge points of the hidden structural element to provide a hidden structural element detection signals average.

Step 614 of averaging surroundings detection signals to provide a surroundings detection signals average.

Step 616 of determining the contrast information based on a relationship between the hidden structural element detection signals average and the surroundings detection average.

The obtaining of the contrast information may include generating a backscattered-related secondary electron image of the region. The generating may include searching for a compensation factor for reducing backscattered electron induced error. It should be noted that this reduction is optional. It should also be noted that depth information may be generated by analysis of only a secondary electron or only from analyzing a backscattered electron image.

Figure 3:
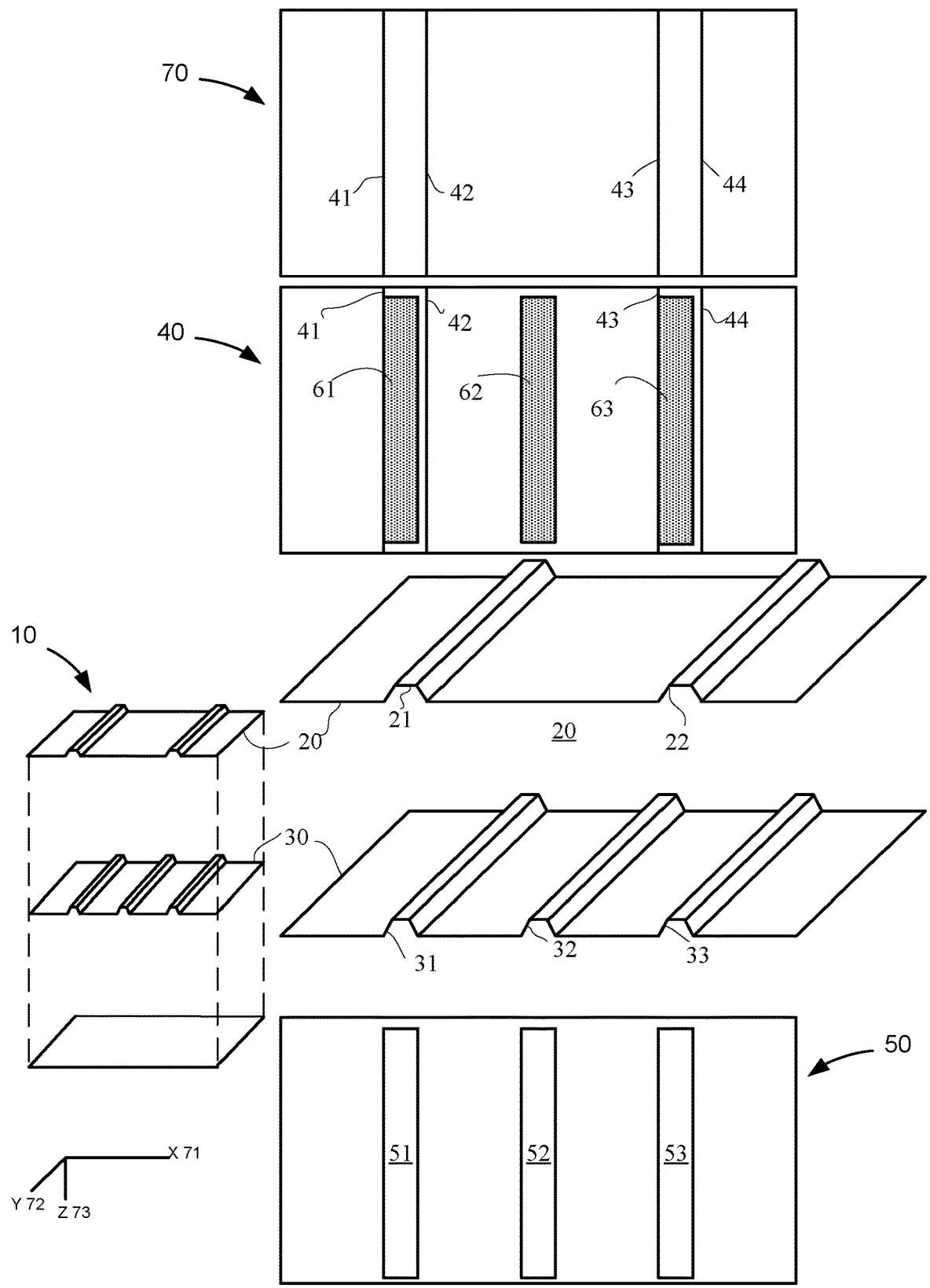
FIG. 3 is an example of a region of a sample.
Figure 5:
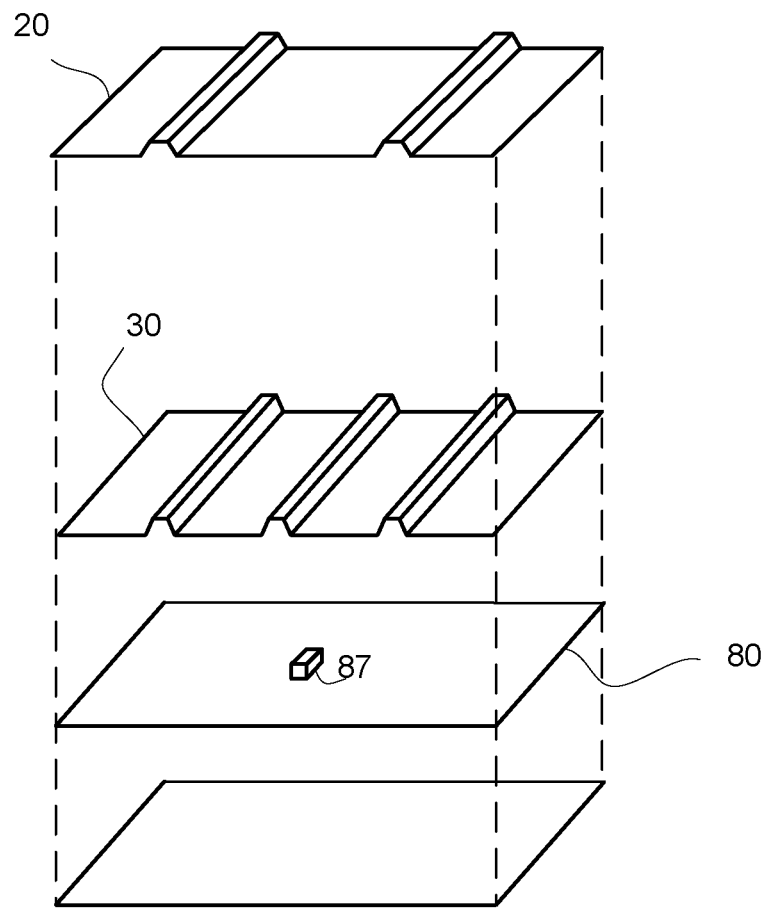
FIG. 5 is an example of a region of a sample.

Some non-limiting example of hidden structural elements include (a) third line 31, fourth line 32 and fifth line 33 of intermediate layer 30 of FIG. 3, and (b) additional structural element 87 of FIG. 5.

Figure 9:
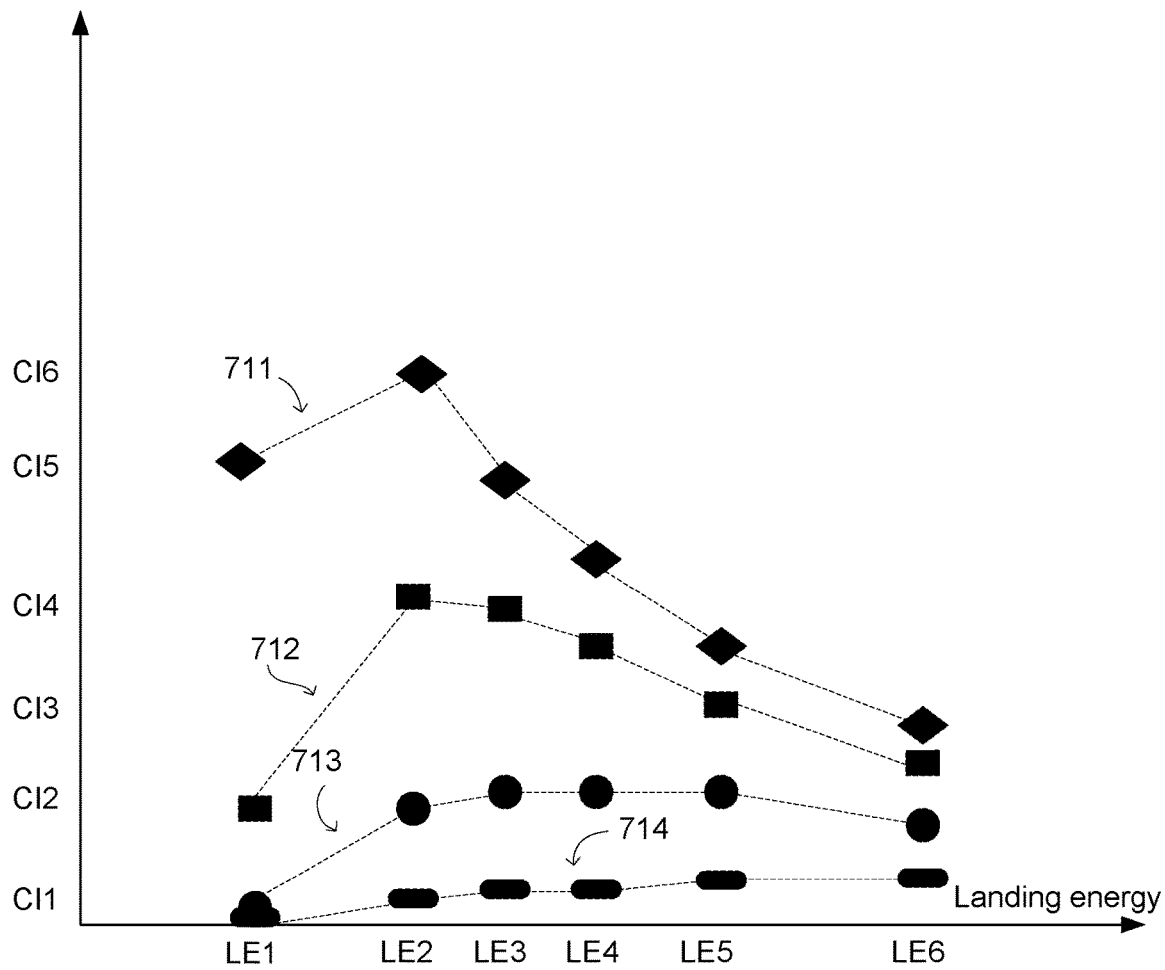
FIG. 9 illustrates examples of contrast information values versus landing energy values.

FIG. 9 illustrates examples of contrast information values (such as CI1, CI2, CI3, CI4, CI5, CI6) versus landing energy values (such as LE1, LE2, L3, LE4, LE5 and LE6) for a hidden structural element when located at different depths, see graphs 711, 712, 713 and 714. Higher contrasts are obtained for shallower positions of the hidden structural elements. Each graph has a peak because each graph illustrates a tradeoff between the absorption of the electrons within the sample and between the transparency of the hidden structural element to the primary electrons beam.

Figure 8:
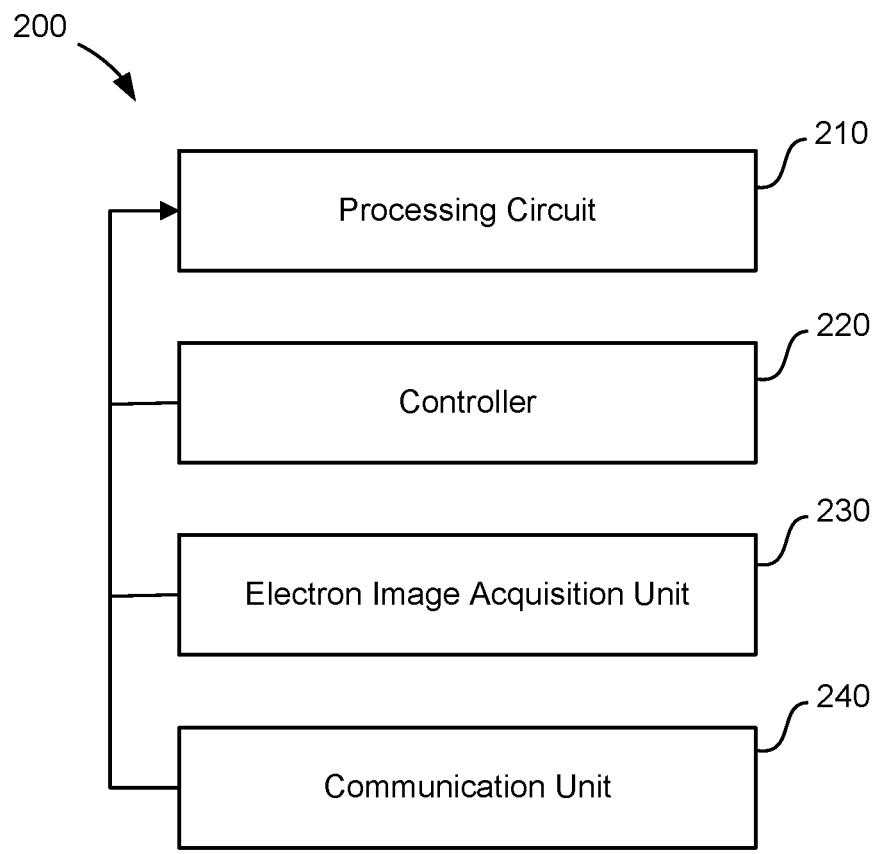
FIG. 8 is an example of a system.

The system 200 of FIG. 8 may be configured to execute method 600. The system may be a scanning electron microscope, an electron imager, a metrology tool, and the like.

Generating a BSE-Induced Secondary Electron Image

Ignoring random noise, the BSE-induced SE value of a SE image pixel is proportional to a BSE signal of the corresponding BSE image pixel multiplied by a physical factor that is a function of various factors including underlayer structures of the sample. For example—assuming that there is an underlayer line that once illuminated provides BSE signals that are stronger by a factor of 1.3 than its surroundings then the BSE-induced SE resulting from illuminating the underlayer line will be stronger by a factor of 1.3 than BSE-induced SE resulting from illuminating the surroundings of the underlayer line. This ratio (1.3) is merely a n example. Furthermore—there may be any ratio between BSE contrast and SE2 contrast of various features in the image at a given depth. This ration may change for different depths.

Figure 2:
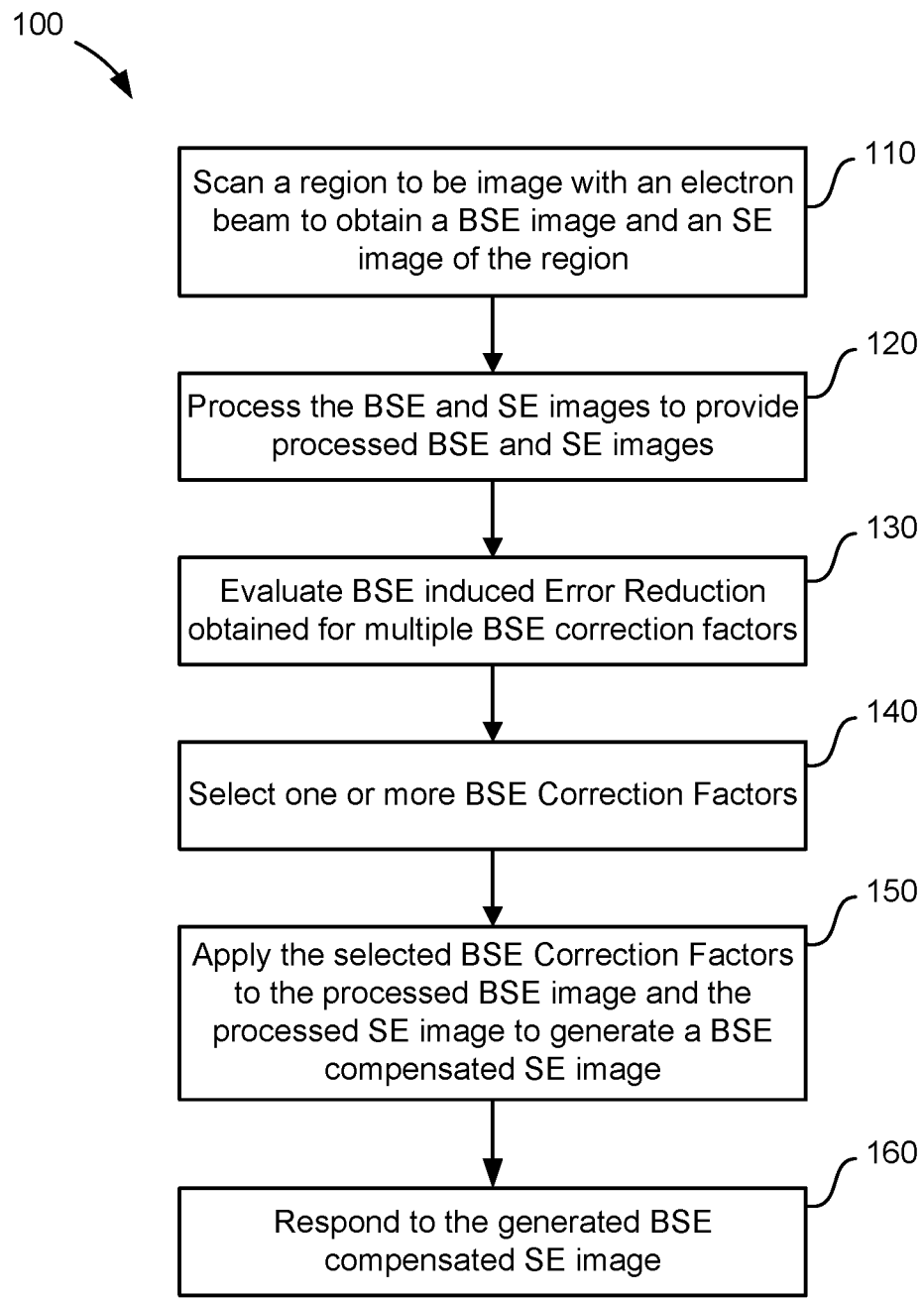
FIG. 2 is an example of a method.

FIG. 2 illustrates a method 100 for improving a quality of a secondary electron image of a region of a sample.

Method 100 may start by step 110 of obtaining a BSE image of the region and a SE image of the region.

The BSE image and the SE image are generated by scanning of the region with an electron beam (also referred to as a primary electron beam). Step 110 may include the scanning. Alternatively, step 110 may not include the scanning—but rather receiving the BSE image and the SE image.

Step 110 may be followed by step 120 of processing the BSE image and the SE image to provide a processed BSE image and a processed SE image.

The processing may be done to improve the accuracy of the outcome of method 100.

Step 120 may include at least one of the following:
Smoothing the SE image to provide a smoothed SE image.
Applying a gradient operation on the smoothed SE image to provide a gradient SE image.
Smoothing the BSE image to provide a smoothed BSE image.
Applying a gradient operation on the smoothed BSE image to provide a gradient BSE image.
Thresholding the gradient BSE image to provide the BSE image. The thresholding may include applying a threshold that has a value that is set based on a range of pixel values of pixels of the gradient BSE image. For example—the threshold may be set to a value that may passing a certain percent of the pixels and resetting the other pixels. For example—passing the pixels having the highest X percent values. X may be 5, 10, 25, 20, 25, 30, 40, 45 percent and the like—or may have any other value. The thresholding may include resetting (for example zeroing) pixels of the gradient BSE image that have a value that is below the threshold. Pixels above the threshold may be remain unchanged.

The smoothing may remove random noise and may increase the signal to noise ratio. The smoothing can include applying any smoothing function—such as but not limited to performing a convolution with an averaging filter or a gaussian filter.

Step 120 may be followed by step 130 of evaluating BSE induced error reduction obtained for multiple BSE correction factors. Step 130 may include testing the BSE induced error reduction for each one of the multiple BSE correction factors. The number of BSE correction factors and their values may be determined in any manner.

Assuming that a BSE correction factor is applied on the entire image then step 130 may include repeating, for each of the multiple BSE correction factors, (a) multiplying the processed BSE image by the BSE correction factor to provide a first intermediate image, (b) subtracting the first intermediate image from the processed SE image to provide a second intermediate image, (c) multiplying the second intermediate image by the processed BSE image to provide a third intermediate image, and (d) calculating a parameter of the third intermediate image.

The first intermediate image may represent the information embedded in BSE-induced secondary electrons.

The parameter of the third intermediate image may be the sum of pixels—but may be any other parameter reflecting the strength of the SE gradients above BSE gradients.

Assuming that a BSE correction factor is applied on a part of an image then step 130 may include repeating, for each of the multiple BSE correction factors, (a) multiplying the part of the processed BSE image by the BSE correction factor to provide a part of a first intermediate image, (b) subtracting the part of the first intermediate image from a corresponding part of the processed SE image to provide a part of a second intermediate image, (c) multiplying the part of the second intermediate image by the part of the processed BSE image to provide a part of a third intermediate image, and (d) calculating a parameter of the part of the third intermediate image. Steps (a) till (d) may repeated from multiple parts.

Step 130 may be followed by step 140 of selecting, out of the multiple BSE correction factors, one or more selected BSE correction factors.

The one or more selected BSE correction factors may be a single BSE correction factor. The single BSE correction factor may be applied on the entire processed BSE image.

The one or more selected BSE correction factor may include two or more selected BSE correction factors to be applied on two or more parts of the processed BSE image.

The two or more parts of the processed BSE image may cover the entire processed BSE image- or may cover only some of the parts of the processed BSE image.

The two or more parts may be selected to at least partially cover underlaying structural elements of the sample that emit BSE. Two or more of these underlaying structural elements may be located at the same depth. At least two of these underlaying structural elements may be located at different depths. Two or more of the underlying structural elements may belong to a same sample layer. At least two of underlaying structural elements may belong to different sample layers.

The two or more parts of the processed BSE image may be defined regardless of the expected locations of the underlaying structural elements. For example, the processed BSE image may be virtually segmented to parts, for example, rectangular parts.

Step 140 may be followed by step 150 of applying the one or more selected BSE correction factors on one or more parts of the processed BSE image and on one or more corresponding parts of the processed SE image to provide a BSE compensated SE image.

Step 150 may include repeating, for each of the parts: (a) multiplying the part of the BSE image by the selected BSE correction factor to provide an intermediate image and (b) subtracting the intermediate image from a corresponding part of the processed SE image.

When there are two or more parts step 150 may include applying an additional step for reducing or eliminating difference between one part of the processed SE image to another, especially at the border between adjacent parts. The additional step may include smoothing, and the like.

Step 150 may be followed by step 160 of responding to the generation of the BSE compensated SE image. This may include at least one of storing the BSE compensated SE image, transmitting the BSE compensated SE image, or further processing the BSE compensated SE image. The further processing may be a part of an evaluation process such as metrology, defect detection, review, and the like. For example—the BSE compensated SE image can be compared to one or more other BSE compensated SE images, compared to reference SE images, or undergo any other evaluation process.

FIG. 3 is an example of a region 10 of a sample, a BSE image 50, a SE image 40 and a BSE compensated SE image 70.

FIG. 3 includes a cartesian coordinate system in which the z-axis (93) corresponds to the depth of the region, whereas the x-axis (91) and the y-axis (92) are applicable per layer of the region. Items that are directly below each other have the same (X,Y) coordinates.

The region 10 of FIG. 3 is three dimensional and includes multiple patterns layers—such as upper layer 20 and intermediate layer 30. There may be any number of patterned layers and of unpatterned layers.

Upper layer 20 is illustrated as including a first line 21 and a second line 22. Each line of the first line and the second line includes a pair of edges that should be visible in a SE image.

Intermediate layer 30 is illustrated as including a third line 31, a fourth line 32 and a fifth line 33.

Any layer of the region may include any type of structural elements, for example a line, a bump, a trench, and the like. The structural elements may form an array of elements, may be organized in an order manner or may be organized in a non-ordered manner.

In FIG. 3, a part of first line 21 is directly above a part of third line 31, and a part of second line 22 is directly above a part of the fifth line 33. This spatial relationships may introduce BSE induced error in the detected SE signals.

BSE image 50 that includes a first BSE area 51 that represents a detection of BSC emitted from the third line 31, a second BSE area 52 that represents a detection of BSC emitted from the fourth line 32, and a third BSE area 53 that represents a detection of BSC emitted from the fifth line 33.

SE image 40 includes relevant SE information and BSE induced error information.

The relevant SE information includes first edge information 41, second edge information 42, third edge information 43 and fourth edge information 44.

The first edge information 41 and the second edge information 42 represent a detection of SE emitted from edges of the first line as a result of an illumination of the first line with the electron beam.

The third edge information 43 and the fourth edge information 44 represent a detection of SE emitted from edges of the second line as a result of an illumination of the second line with the electron beam.

The BSE induced error information includes (a) a first BSE induced error area 61 that represents a detection of SE emitted from the region due to an emission of BSE from the third line 31, (b) a second BSE induced error area 62 that represents a detection of SE emitted from the region due to an emission of BSE from the fourth line 32, and (c) a third BSE induced error area 63 that represents a detection of SE emitted from the region due to an emission of BSE from the fifth line 33.

In the BSE compensated SE image 70, the BSE induced error information was removed—leaving the first edge information 41, second edge information 42, third edge information 43 and fourth edge information 44.

Figure 4:
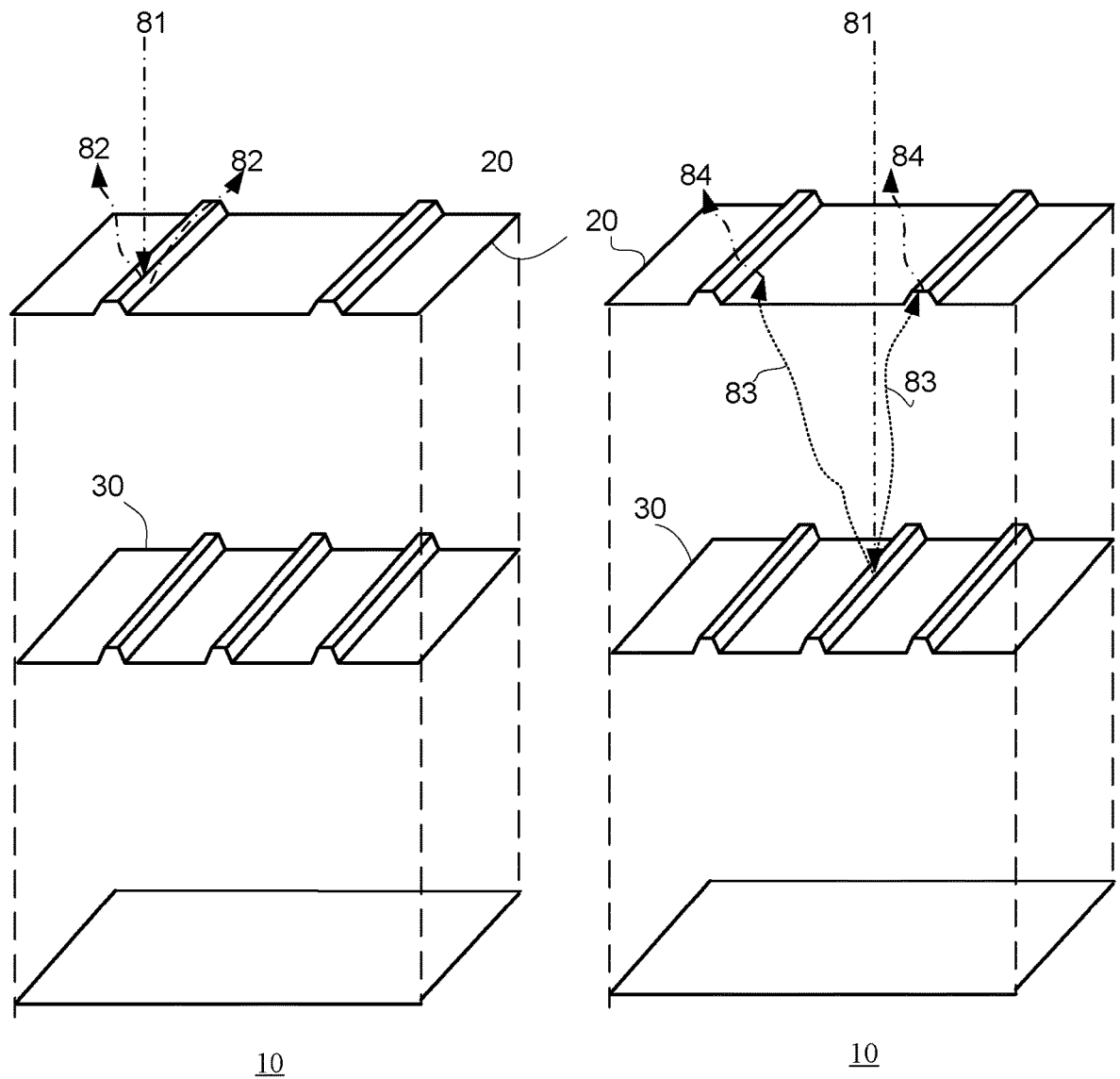
FIG. 4 is an example of a region of a sample.

FIG. 4 illustrates an example of SE 82 emitted from the first line due to an illumination of the first line with an electron beam 81.

FIG. 4 also illustrates an example an illumination, with electron beam 81, of the fourth line 34, the emission of BSE 83 from the fourth line, the impingement of the BSE 83 on the first layer 20 and the emission of BSE induced error signals—such as SE 84.

While FIGS. 3 and 4 illustrated two patterned layers, FIG. 5 illustrates a region 11 that includes upper layer 20, intermediate layer 30 and an additional layer 80 located below the intermediate layer—and includes an additional structural element 87 that may emit BSE that may cause additional BSE induced error signals to be emitted from the region.

Figure 6:
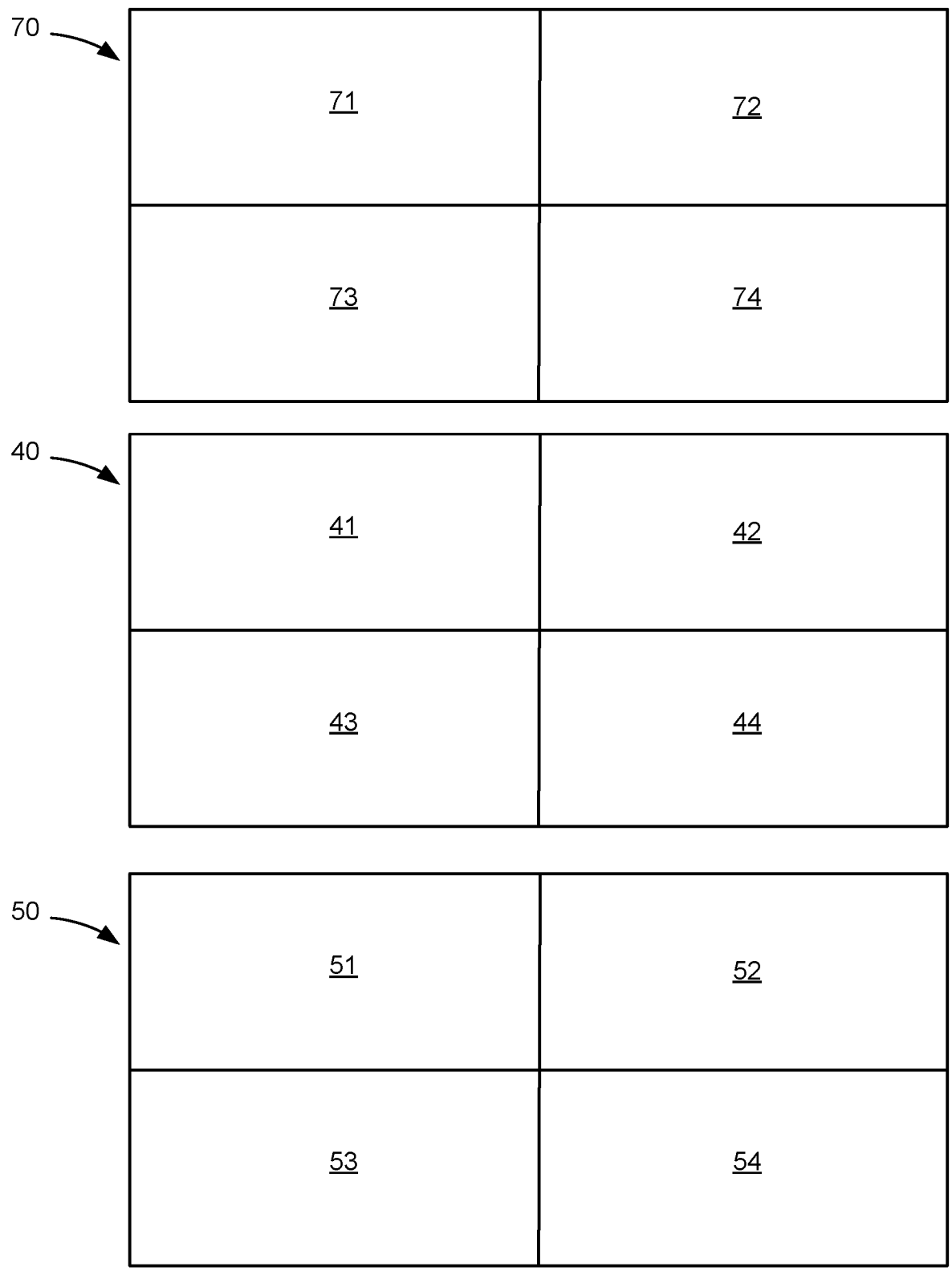
FIG. 6 is an example of a parts of electron images.

FIG. 6 illustrates a virtual segmentation of the SE image 40 to SE image parts 41, 42, 43 and 44, a virtual segmentation of the BSE image 50 to corresponding BSE image parts 51, 52, 53 and 54, and the virtual segmentation of the BSE compensated SE image 70 to corresponding BSE compensated SE image parts 71, 72, 73 and 74. Different BSE correction factors can be applied for the different parts.

Figure 7:
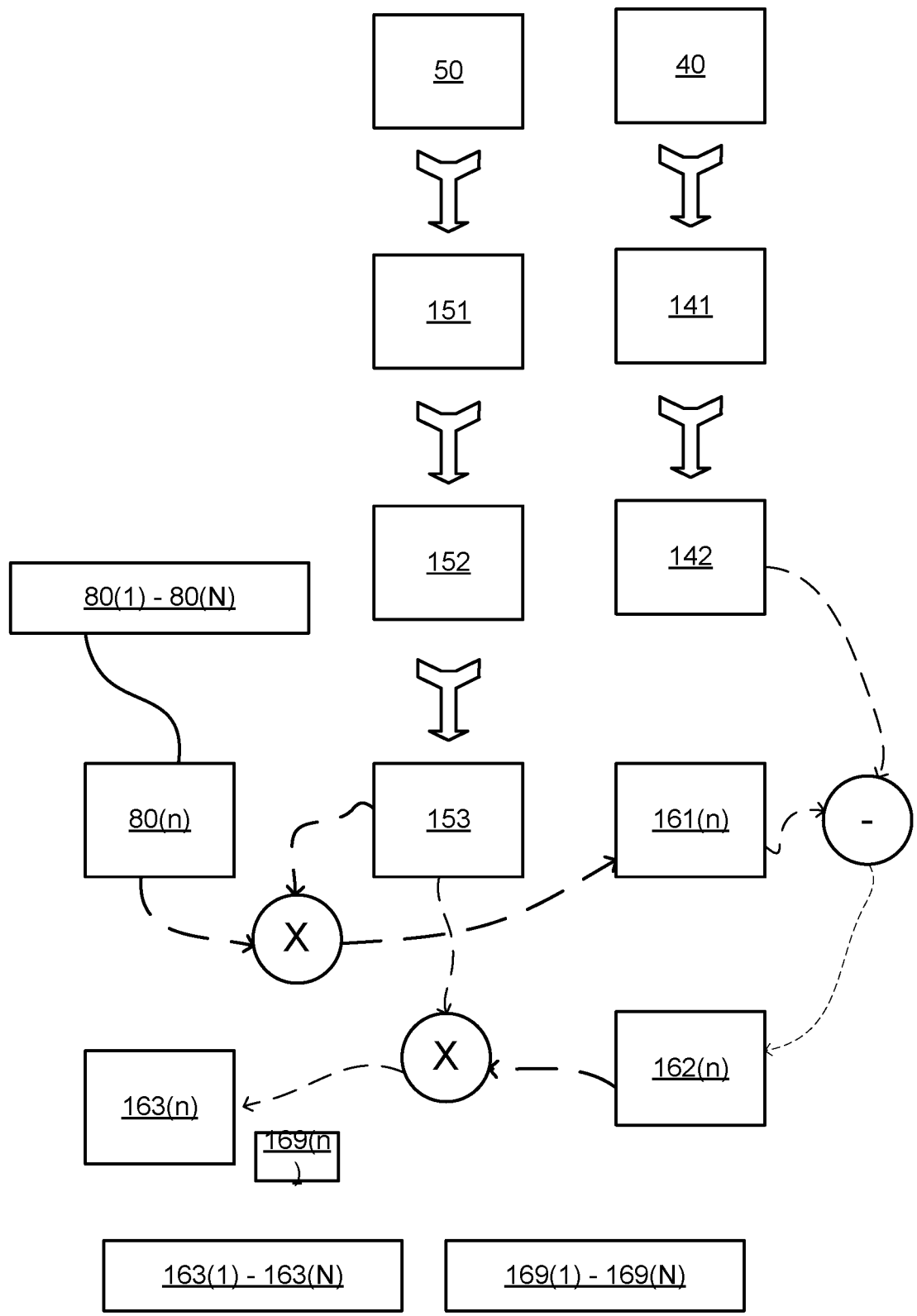
FIG. 7 is an example of various steps of a method and various data structures.

FIG. 7 illustrates an example of various steps of method 100 and various data structures.

FIG. 7 illustrates the following:
Smoothing the SE image 40 to provide a smoothed SE image 141.
Applying a gradient operation on the smoothed SE image 141 to provide a processed SE image 142 such as a gradient SE image.
Smoothing the BSE image 50 to provide a smoothed BSE image 151.
Applying a gradient operation on the smoothed BSE image 151 to provide a processed BSE image 152 such as a gradient BSE image.
Thresholding the gradient BSE image 152 to provide the processed BSE image 153.
Assuming that N BSE correction factors (80(1)-80(N)) are evaluated (N being a positive integer) and that index n ranges between 1 and N. Under these assumption—the evaluation of the n'th BSE correction factor (80($n$)) includes:
Multiplying the processed BSE image 153 by the n'th BSE correction factor 80($n$) to provide a first intermediate image 161($n$).

Subtracting the first intermediate image 161(*n*) from the processed SE image 142 to provide a second intermediate image 162(*n*).

Multiplying the second intermediate image 162(*n*) by the processed BSE image 152 to provide a third intermediate image 163(*n*).

Calculating a parameter 169(*n*) of the third intermediate image 163(*n*).

After checking N BSE correction factors (80(1)-80(N)) there are N third intermediate images 163(1)-163(N) having N parameter 169(1)-169(N) and one of the BSE correction factors is selected based on the value of its parameter. For example, selecting the parameter that is indicative of the lowest BSE induced error.

FIG. 8 is an example of a system 200.

System 200 may include a processing circuit 210 configured to process electron images and may be configured to execute at least some steps of method 100.

The processing circuit may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

System 200 may also include a controller 220 for controlling the system 200.

System 200 may include electron image acquisition unit 230 for acquiring the SE image and/or the BSE image.

The system 200 may be an electron microscope, an electron imager, or may be a computerized system that receives the electron image from electron microscope, an electron imager, and the like.

System 200 may include a communication unit or an interface 240 for receiving the electron image.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

What is claimed is:

1. A method for determining a depth of a hidden structural element formed on a sample, the method comprising:

scanning a region of interest of the sample with an illuminating electron beam causing emission of electrons from the sample, wherein the region of interest comprises a first sample portion in which the hidden structural element is located and second sample portion surrounding the hidden structural element;

detecting electrons generated during the scanning with an electron detector to generate: (a) hidden structural element detection signals that are indicative of electrons emitted from the hidden structural element in the first sample portion, and (b) surroundings detection signals that are indicative of electrons emitted from the second sample portion;

determining contrast information based on a relationship between the hidden structural detection signals and the surroundings detection signals; and determining the depth of the hidden structural element based, at least in part, on the contrast information.

2. The method according to claim 1 wherein the hidden structural element detection signals and the surroundings detection signals are indicative of detected backscattered electrons.

3. The method according to claim 1 wherein the hidden structural element detection signals and the surroundings detection signals are indicative of detected backscattered-related secondary electrons; wherein backscattered-related secondary electrons are emitted from a surface of the sample due to an emission of backscattered electrons from the sample.

4. The method according to claim 1 wherein the hidden structural element detection signals and the surroundings detection signals are indicative of detected backscattered electrons and are indicative of detected backscattered-related secondary electrons; wherein backscattered-related secondary electrons are emitted from a surface of the sample due to an emission of backscattered electrons from the sample.

5. The method according to claim 1 wherein the determining of the depth of the hidden structural element is also based on at least one evaluation process parameter.

6. The method according to claim 1 wherein the determining of the depth of the hidden structural element is also based on an evaluation process parameter applied during the scanning.

7. The method according to claim 6 wherein the contrast information is obtained while using the evaluation process parameter of a first value; wherein the method further comprises applying additional contrast information while applying an evaluation process parameter of a second value; and wherein the determining is also based on the additional contrast information.

8. The method according to claim 1 wherein the obtaining of the contrast information comprises generating a backscattered-related secondary electron image of the region.

9. The method according to claim 1 wherein the electrons generated during the step of scanning a region of interest of the sample with an illuminating electron beam comprise secondary electrons emitted from a surface of the sample and backscattered electrons (BSE) emitted from below the surface of the sample and the hidden structure detection signals and the surroundings detection signals form a part of a BSE image.

10. The method according to claim 9 wherein the hidden structure detection signals and the surroundings detection signals are BSE-induced secondary electrons.

11. A method for determining a depth of a hidden structural element formed on a sample, the method comprising:

scanning a region of interest of the sample with an illuminating electron beam causing emission of electrons from the sample, wherein the region of interest comprises a first sample portion in which the hidden structural element is located and second sample portion surrounding the hidden structural element;

detecting electrons generated during the scanning with an electron detector to generate:
(a) hidden structural element detection signals that are indicative of electrons emitted from the hidden structural element in the first sample portion, and (b) surroundings detection signals that are indicative of electrons emitted from the second sample portion;

determining contrast information based on a relationship between the hidden structural detection signals and the surroundings detection signals; and determining the depth of the hidden structural element based, at least in part, on the contrast information based on path information indicative of one or more paths between a surface of the sample and at least one out of the hidden structural element and the surroundings.

12. A method for determining a depth of a hidden structural element formed on a sample, the method comprising:

scanning a region of interest of the sample with an illuminating electron beam causing emission of electrons from the sample, wherein the region of interest comprises a first sample portion in which the hidden structural element is located and second sample portion surrounding the hidden structural element;

detecting electrons generated during the scanning with an electron detector to generate: (a) hidden structural element detection signals that are indicative of electrons emitted from the hidden structural element in the first sample portion, and (b) surroundings detection signals that are indicative of electrons emitted from the second sample portion; and determining contrast information based on a relationship between the hidden structural detection signals and the surroundings detection signals;

wherein the obtaining of the contrast information comprises: (i) averaging hidden structural element detection signals related to electrons emitted from non-edge points of the hidden structural element to provide a hidden structural element detection signals average, (ii) averaging surroundings detection signals to provide a surroundings detection signals average, and (iii) determining the contrast information based on a relationship between the hidden structural element detection signals average and the surroundings detection average.

13. A method for determining a depth of a hidden structural element formed on a sample, the method comprising:

scanning a region of interest of the sample with an illuminating electron beam causing emission of electrons from the sample, wherein the region of interest comprises a first sample portion in which the hidden structural element is located and second sample portion surrounding the hidden structural element;

detecting electrons generated during the scanning with an electron detector to generate: (a) hidden structural element detection signals that are indicative of electrons emitted from the hidden structural element in the first sample portion, and (b) surroundings detection signals that are indicative of electrons emitted from the second sample portion; and determining contrast information based on a relationship between the hidden structural detection signals and the surroundings detection signals;

wherein the obtaining of the contrast information comprises generating a backscattered-related secondary electron image of the region; and wherein the generating of the backscattered-related secondary electron image comprises searching for a compensation factor for reducing backscattered electron induced error.

14. A non-transitory computer-readable medium for determining a depth of a hidden structural element of an sample, the non-transitory computer-readable medium comprising instructions for:

scanning a region of interest of the sample with an illuminating electron beam causing emission of electrons from the sample, wherein the region of interest comprises a first sample portion in which the hidden structural element is located and second sample portion surrounding the hidden structural element;

detecting electrons generated during the scanning with an electron detector to generate: (a) hidden structural element detection signals that are indicative of electrons emitted from the hidden structural element in the first sample portion, and (b) surroundings detection signals that are indicative of electrons emitted from the second sample portion;

determining contrast information based on a relationship between the hidden structural detection signals and the surroundings detection signals; and determining the depth of the hidden structural element based, at least in part, on the contrast information.

15. The non-transitory computer-readable medium according to claim 14 wherein the hidden structural element detection signals and the surroundings detection signals are indicative of detected backscattered electrons.

16. The non-transitory computer-readable medium according to claim 14 wherein the hidden structural element detection signals and the surroundings detection signals are indicative of detected backscattered-related secondary electrons; wherein backscattered-related secondary electrons are emitted from a surface of the sample due to an emission of backscattered electrons from the sample.

17. The non-transitory computer-readable medium according to claim 14 wherein the hidden structural element detection signals and the surroundings detection signals are indicative of detected backscattered electrons and are indicative of detected backscattered-related secondary electrons; wherein backscattered-related secondary electrons are emitted from a surface of the sample due to an emission of backscattered electrons from the sample.

18. A computerized system for determining a depth of a hidden structural element of an sample, the computerized system comprises:

a processing circuit that is configured to:
(i) scan a region of interest of the sample with an illuminating electron beam causing emission of electrons from the sample, wherein the region of interest comprises a first sample portion in which the hidden structural element is located and second sample portion surrounding the hidden structural element;
(ii) detect electrons generated during the scanning with an electron detector to generate: (a) hidden structural element detection signals that are indicative of electrons emitted from the hidden structural element in the first sample portion, and (b) surroundings detection signals that are indicative of electrons emitted from the second sample portion;
determine contrast information based on a relationship between the hidden structural detection signals and the surroundings detection signals; and
(ii) determine the depth of the hidden structural element based, at least in part, on the contrast information.

19. The computerized system according to claim 18 wherein the processing circuit is further configured to determine depth of the hidden structural element based on path information indicative of one or more paths between a surface of the sample and at least one out of the hidden structural element and the surroundings.

20. The non-transitory computer-readable medium according to claim 14 wherein the determining of the depth of the hidden structural element is also based on path information indicative of one or more paths between a surface of the sample and at least one out of the hidden structural element and the surroundings.

* * * * *